(12) United States Patent
Yoneda et al.

(10) Patent No.: US 10,095,090 B2
(45) Date of Patent: Oct. 9, 2018

(54) IMAGING APPARATUS

(71) Applicant: SONY CORPORATION, Tokyo (JP)

(72) Inventors: Naofumi Yoneda, Tokyo (JP); Tatsuya Nishiyama, Kanagawa (JP); Yoshimasa Sakishita, Kanagawa (JP); Tadashi Isoda, Tokyo (JP); Kenji Himeno, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 23 days.

(21) Appl. No.: 15/505,188

(22) PCT Filed: Jun. 23, 2015

(86) PCT No.: PCT/JP2015/068027
§ 371 (c)(1),
(2) Date: Feb. 20, 2017

(87) PCT Pub. No.: WO2016/031369
PCT Pub. Date: Mar. 3, 2016

(65) Prior Publication Data
US 2017/0261840 A1 Sep. 14, 2017

(30) Foreign Application Priority Data
Aug. 29, 2014 (JP) .................. 2014-175294

(51) Int. Cl.
G03B 17/55 (2006.01)
H04N 5/225 (2006.01)
H05K 7/20 (2006.01)

(52) U.S. Cl.
CPC ........... *G03B 17/55* (2013.01); *H04N 5/2252* (2013.01); *H05K 7/20154* (2013.01); *H05K 7/20172* (2013.01); *H05K 7/20409* (2013.01)

(58) Field of Classification Search
CPC ............... G03B 17/55; H05K 7/20154; H05K 7/20409; H05K 7/20172; H04N 5/2252
See application file for complete search history.

(56) References Cited

U.S. PATENT DOCUMENTS 9,485,451 B2 * 11/2016 Kawamura .......... H04N 5/2252
2006/0219396 A1 * 10/2006 Abei .................... F28D 1/0333
165/164

(Continued)

FOREIGN PATENT DOCUMENTS

CN 103634511 A 3/2014
JP 2008-103491 A 5/2008

(Continued)

OTHER PUBLICATIONS

International Search Report and Written Opinion of PCT Application No. PCT/JP2015/068027, dated Sep. 29, 2015, 10 pages of English Translation and 9 pages of ISRWO.

(Continued)

*Primary Examiner* — Hung Lam
(74) *Attorney, Agent, or Firm* — Chip Law Group

(57) ABSTRACT

A duct 45 is tubular and has one opening 451 that is mounted in a position to face an inlet port provided in one side of an apparatus body and the other opening 452 that is mounted in a position to face an exhaust port provided in the other side of the apparatus body. In a tubular interior of the duct 45, a fan 43 and a radiating fin 42 are provided. The fan 43 causes outside air to flow in from the inlet port for discharge from the exhaust port, and heat caused inside the apparatus body is transmitted by a heat transfer unit to the radiating fin 42. The outside air is applied to the radiating fin 42 by the fan 43, whereby the heat caused inside the apparatus body can be discharged efficiently.

9 Claims, 13 Drawing Sheets

(56) References Cited

U.S. PATENT DOCUMENTS

| | | | |
|---|---|---|---|
| 2014/0055671 A1 | 2/2014 | Kawamura | |
| 2015/0010338 A1* | 1/2015 | Miyagawa | G03G 21/206 |
| | | | 399/341 |
| 2015/0071677 A1* | 3/2015 | Hirasawa | G03G 21/206 |
| | | | 399/94 |
| 2015/0216090 A1* | 7/2015 | Sakuma | H05K 7/202 |
| | | | 361/697 |

FOREIGN PATENT DOCUMENTS

| | | |
|---|---|---|
| JP | 2009-071516 A | 4/2009 |
| JP | 2009-151037 A | 7/2009 |
| JP | 2011-077403 A | 4/2011 |
| JP | 2011-109393 A | 6/2011 |
| JP | 2013-219590 A | 10/2013 |
| JP | 2014-044293 A | 3/2014 |
| JP | 2014-045345 A | 3/2014 |
| JP | 2014-056082 A | 3/2014 |

OTHER PUBLICATIONS

International Preliminary Report on Patentability of PCT Application No. PCT/JP2015/068027, dated Mar. 9, 2017, 10 pages of English Translation and 6 pages of IPRP.

* cited by examiner

IMAGING APPARATUS

CROSS REFERENCE TO RELATED APPLICATIONS

This application is a U.S. National Phase of International Patent Application No PCT/JP2015/068027 filed on Jun. 23, 2015, which claims priority benefit of Japanese Patent Application No. JP 2014-175294 filed in the Japan Patent Office on Aug. 29, 2014. Each of the above-referenced applications is hereby incorporated herein by reference in its entirety.

TECHNICAL FIELD

The present technology relates to a heat dissipating function of an imaging apparatus.

BACKGROUND ART

A conventional imaging apparatus such as a commercial video camera used for video production consumes a large amount of power and generates a large quantity of heat. For this reason, in Patent Document 1, air heated inside an apparatus body is released into a space through a vent hole provided in an upper surface of the apparatus body and then released outside the apparatus body through a heat release hole from the space for natural cooling. Moreover, the heat release hole and the vent hole are provided in offset relation, whereby water drops entering from the heat release hole are prevented from entering the vent hole.

CITATION LIST

Patent Document

Patent Document 1: Japanese Patent Application Laid-Open No. 2011-109393

SUMMARY OF THE INVENTION

Problem to be Solved by the Invention

By the way, associated with an increasing number of pixels and others, an increasingly larger amount of electric power is consumed by the imaging apparatus. For this reason, devices inside the apparatus body are hard to cool sufficiently with the natural cooling.

An object of the present technology is therefore to provide an imaging apparatus capable of efficiently discharging heat caused inside the apparatus.

Solutions to Problem

An imaging apparatus according to a first aspect of the present technology includes:

a tubular duct having one opening mounted in a position to face an inlet port provided in one side of an apparatus body, and another opening mounted in a position to face an exhaust port provided in another side of the apparatus body;

a fan provided in a tubular interior of the duct for causing outside air to flow in from the inlet port for discharge from the exhaust port;

a radiating fin provided in the tubular interior of the duct; and a heat transfer unit for transmitting heat caused inside the apparatus body to the radiating fin.

The imaging apparatus according to this technology includes the duct, the fan, and the heat transfer unit. The duct is tubular and is provided, for example, in an upper portion of the apparatus body. The one opening of the duct is in the position to face the inlet port provided in the one side of the apparatus body, while the other opening of the duct is in the position to face the exhaust port provided in the other side of the apparatus body. The apparatus body is provided with a recess on its side in planar view, and the recess is provided with, in its bottom face, the exhaust port or both the exhaust port and the inlet port. The fan that causes the outside air to flow in from the inlet port for discharge from the exhaust port, and the radiating fin are provided in the tubular interior of the duct. The heat transfer unit transmits to the radiating fin the heat caused inside the apparatus body, such as heat generated by units other than an imaging unit that is formed of an image sensor or formed of the image sensor and a drive circuit for driving the image sensor. Moreover, heat generated by the imaging unit is dissipated through a housing of the apparatus body.

Parts of connection between the duct and the side of the apparatus body, a feed part for the fan in the duct, and a part of the duct where the heat transfer unit is mounted are formed to have watertightness. Moreover, in cases where the side provided with the exhaust port is provided with a connection terminal for connection with a signal cable or the like, the connection terminal is provided on a side of the recess in a position below the exhaust port.

Effects of the Invention

According to this technology, the tubular duct having the one opening mounted in the position to face the inlet port provided in the one side of the apparatus body and the other opening mounted in the position to face the exhaust port provided in the other side of the apparatus body, the fan provided in the tubular interior of the duct for causing the outside air to flow in from the inlet port for discharge from the exhaust port, the radiating fin provided in the tubular interior of the duct, and the heat transfer unit for transmitting the heat caused inside the apparatus body to the radiating fin are provided. Thus, the heat caused inside the apparatus can be discharged efficiently out of the apparatus. It is to be noted that effects described in the present specification are shown just as examples and are not limiting, and there may be added effects.

MODE FOR CARRYING OUT THE INVENTION

Figure 1:
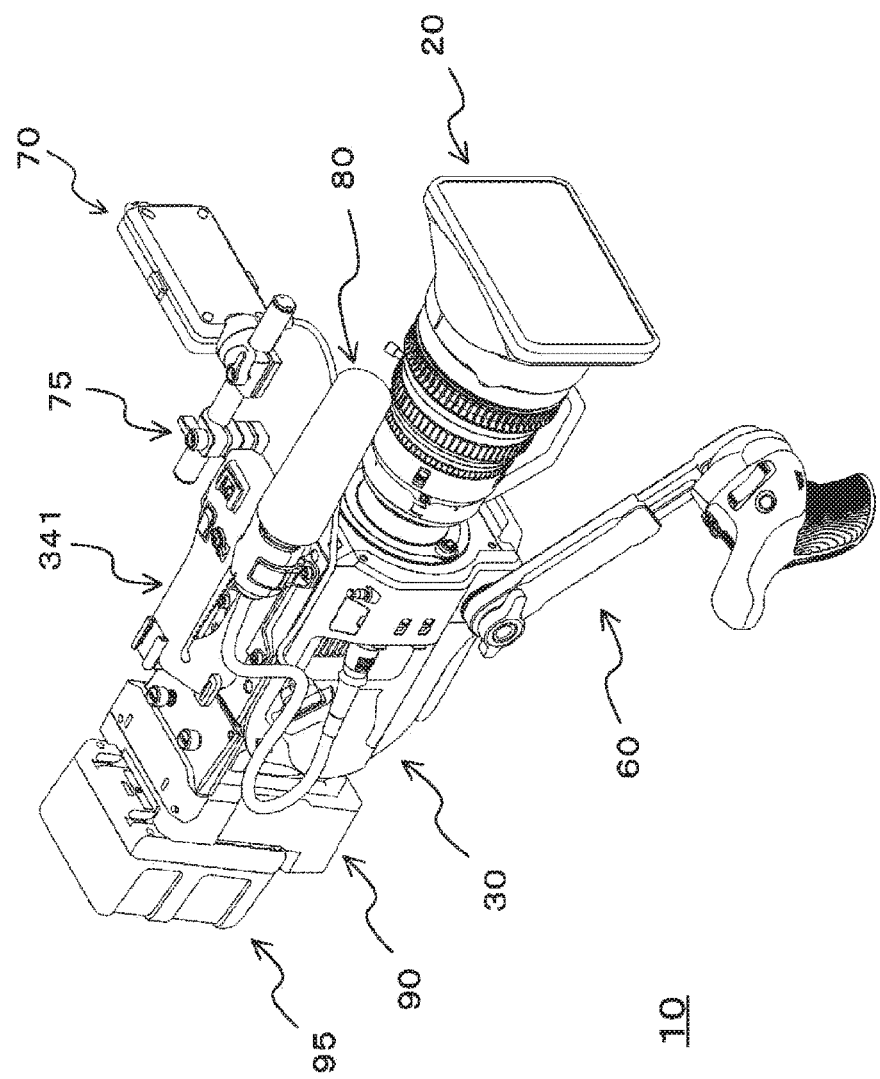
FIG. 1 is a perspective view of an imaging apparatus viewed from a right front of the apparatus.
Figure 2:
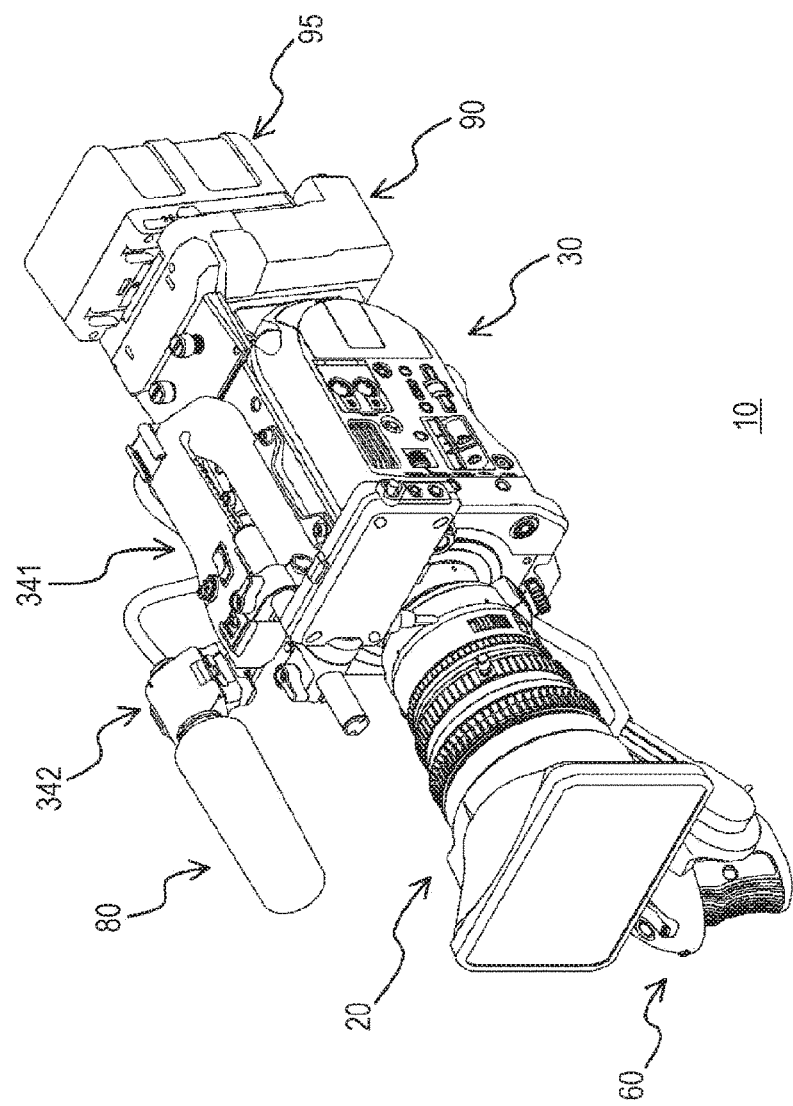
FIG. 2 is a perspective view of the imaging apparatus viewed from a left front of the apparatus.
Figure 3:
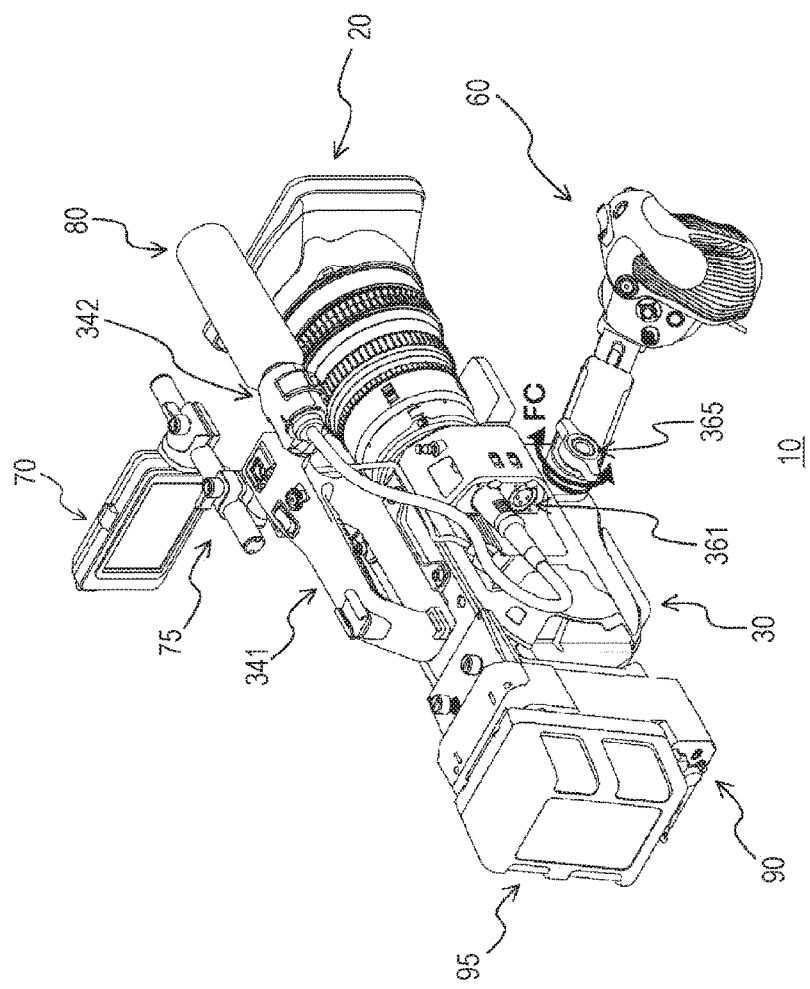
FIG. 3 is a perspective view of the imaging apparatus viewed from a right rear of the apparatus.
Figure 4:
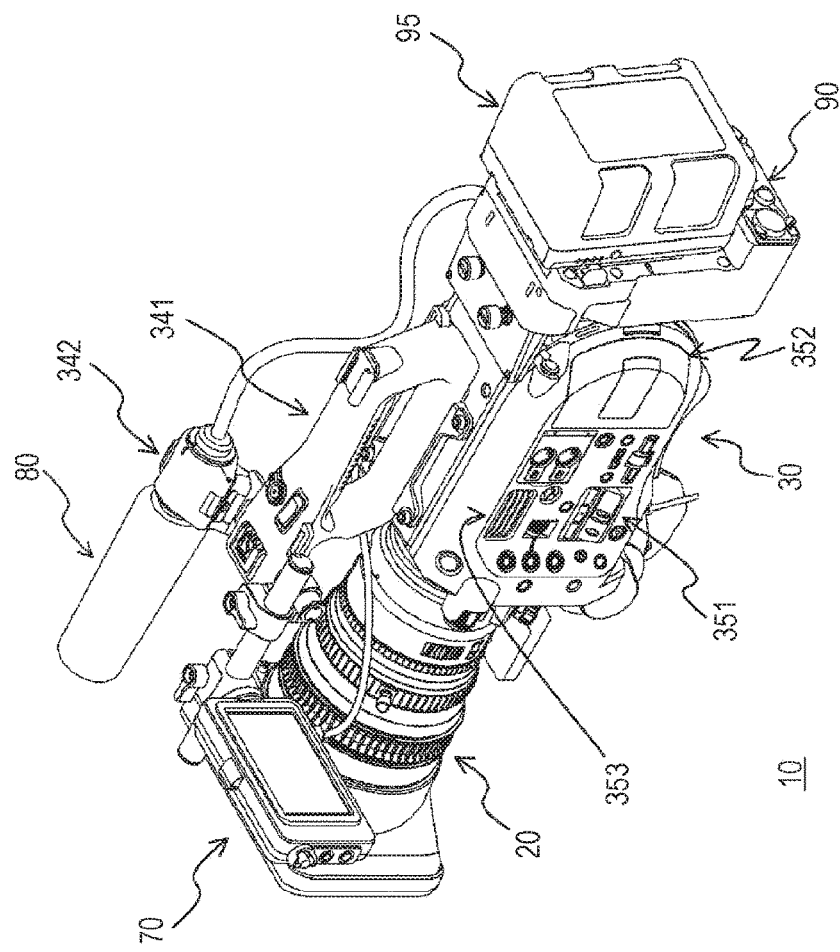
FIG. 4 is a perspective view of the imaging apparatus viewed from a left rear of the apparatus.
Figure 5:
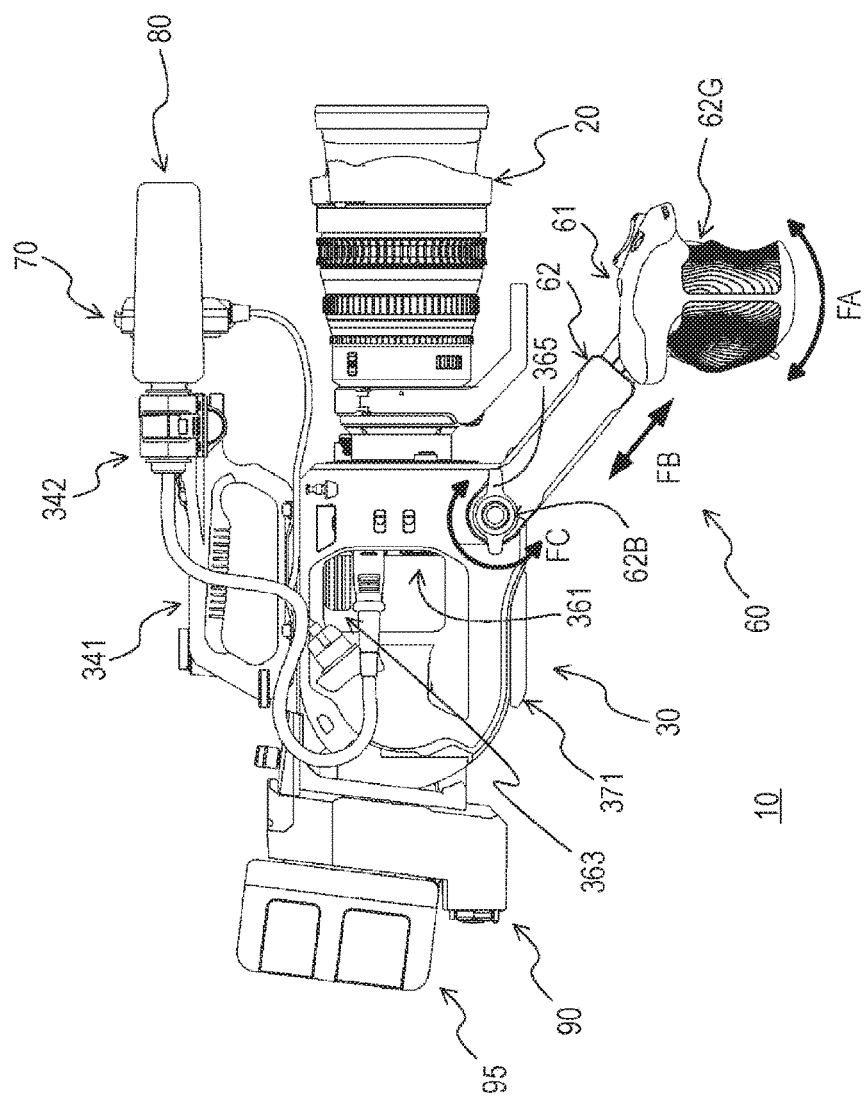
FIG. 5 is a right side view of the imaging apparatus.
Figure 6:
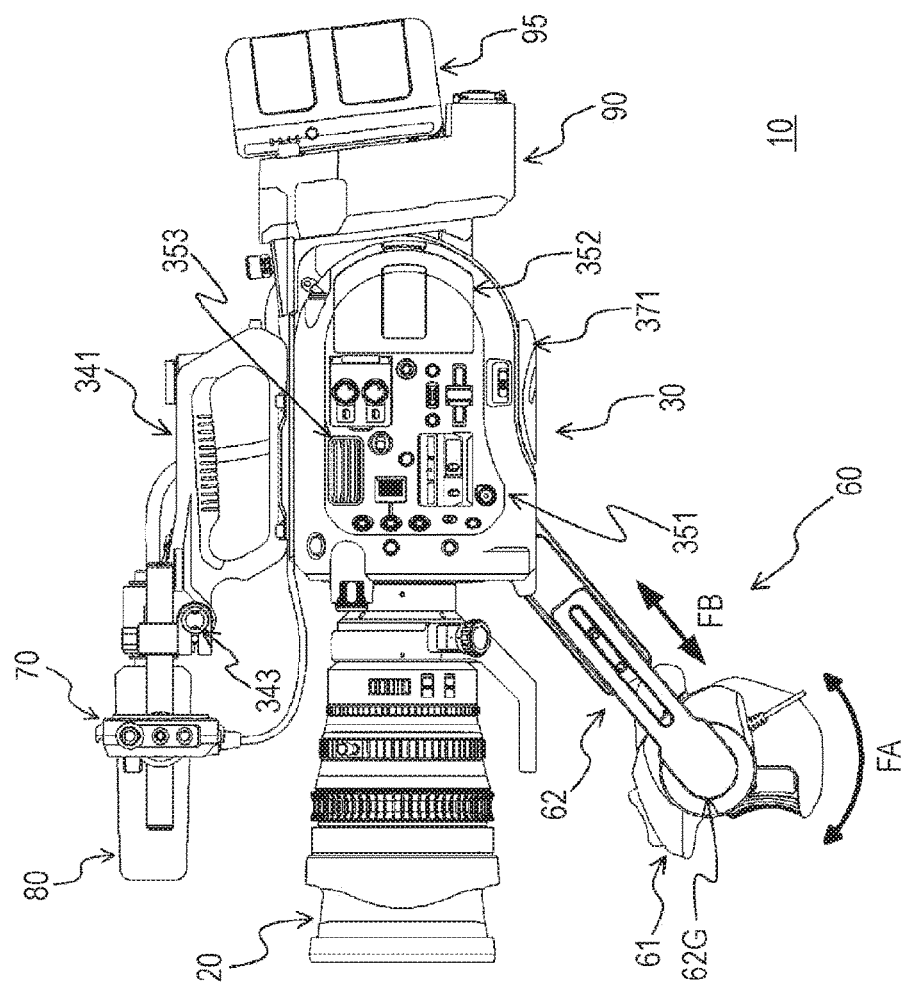
FIG. 6 is a left side view of the imaging apparatus.
Figure 7:
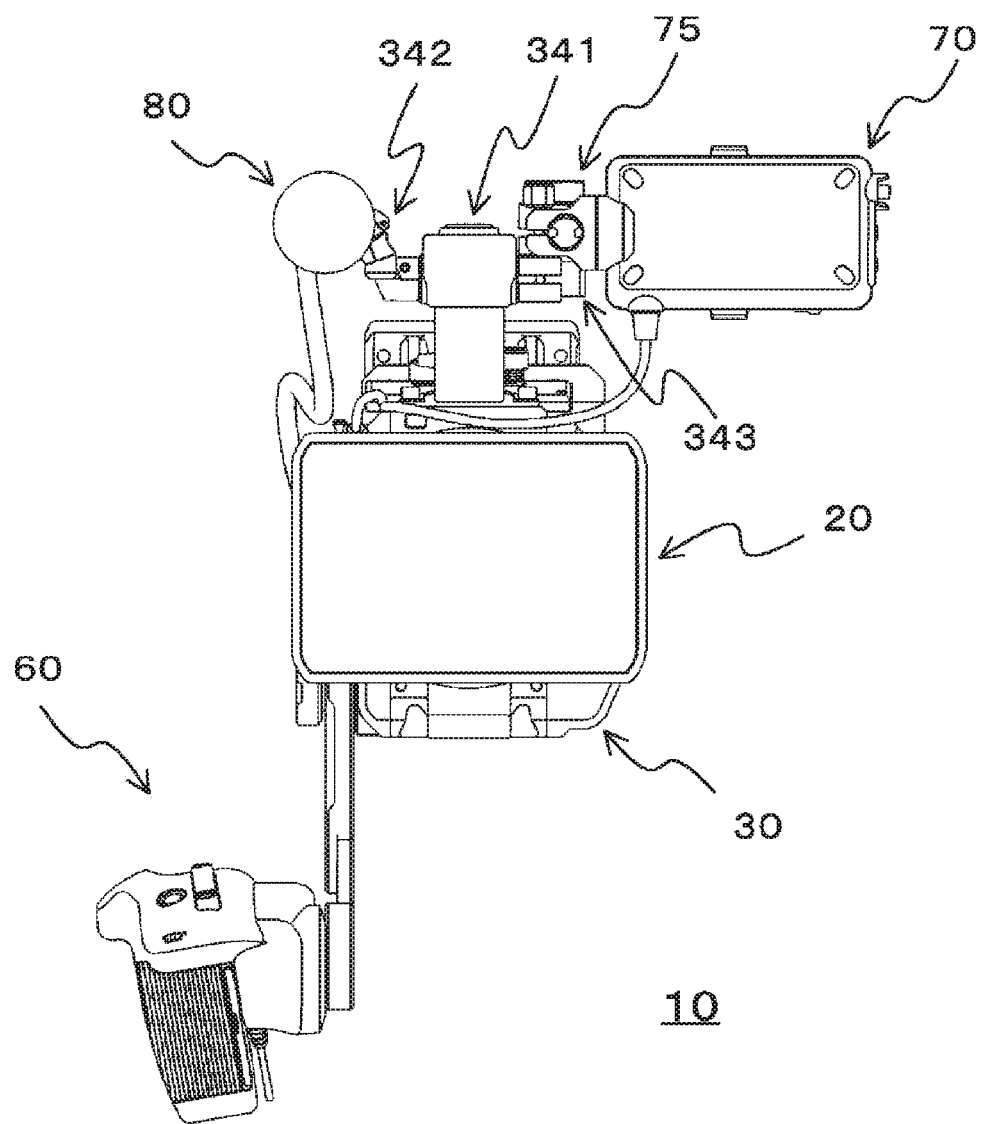
FIG. 7 is a front view of the imaging apparatus.
Figure 8:
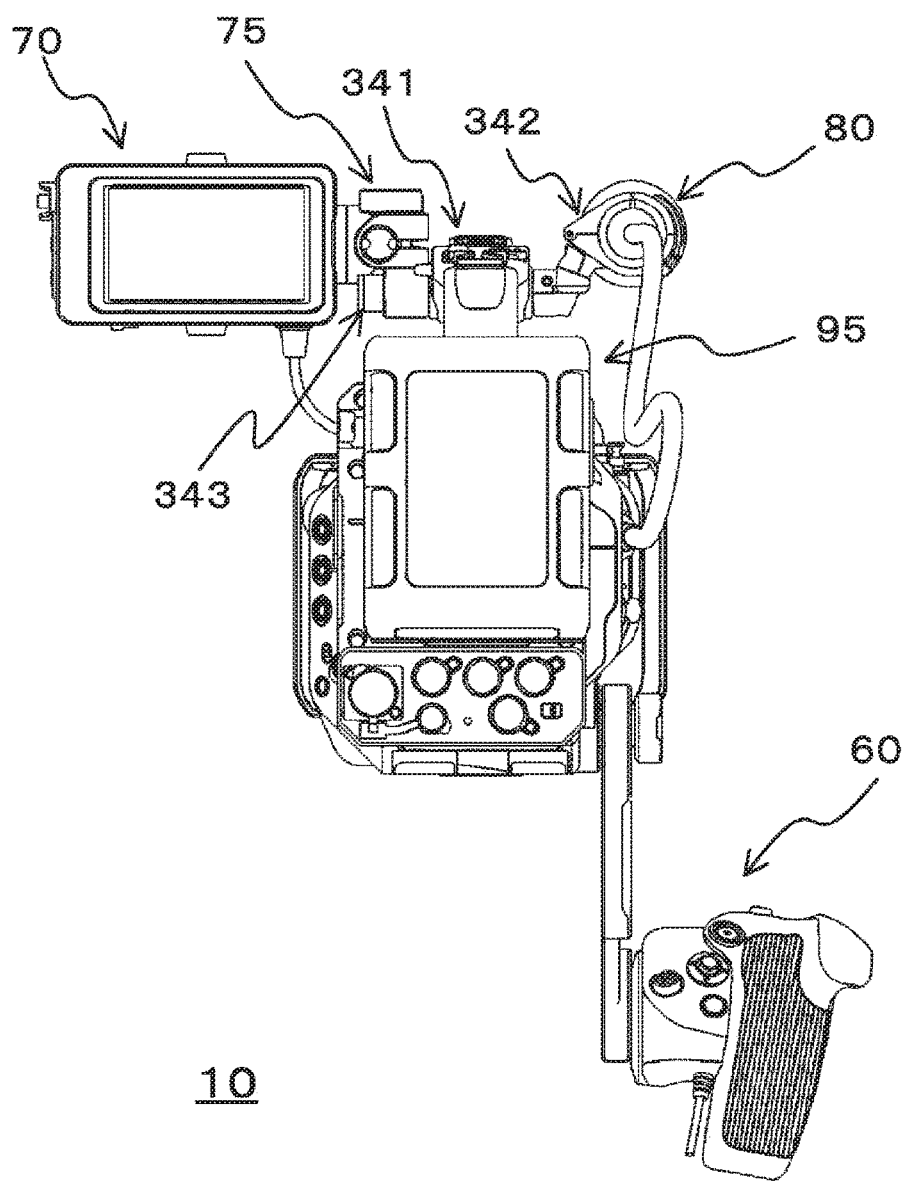
FIG. 8 is a rear view of the imaging apparatus.
Figure 9:
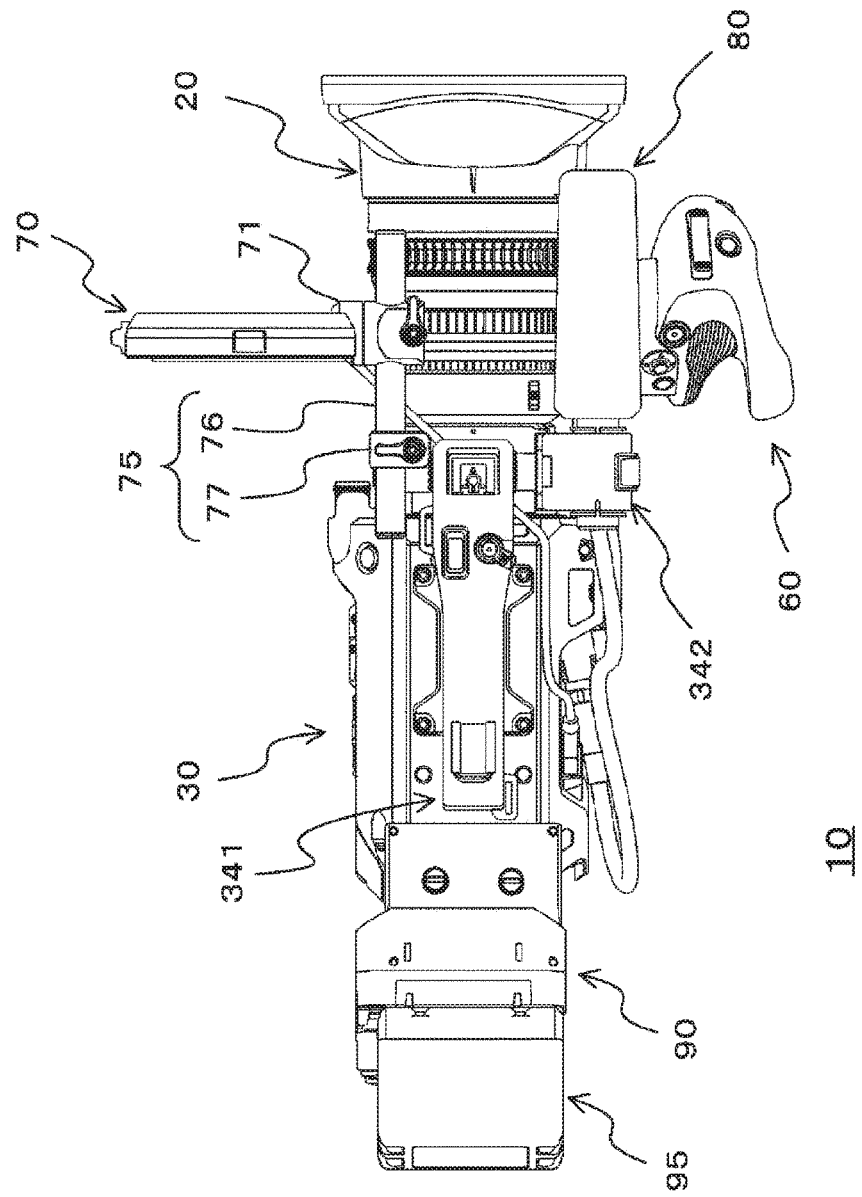
FIG. 9 is a plan view of the imaging apparatus.
Figure 10:
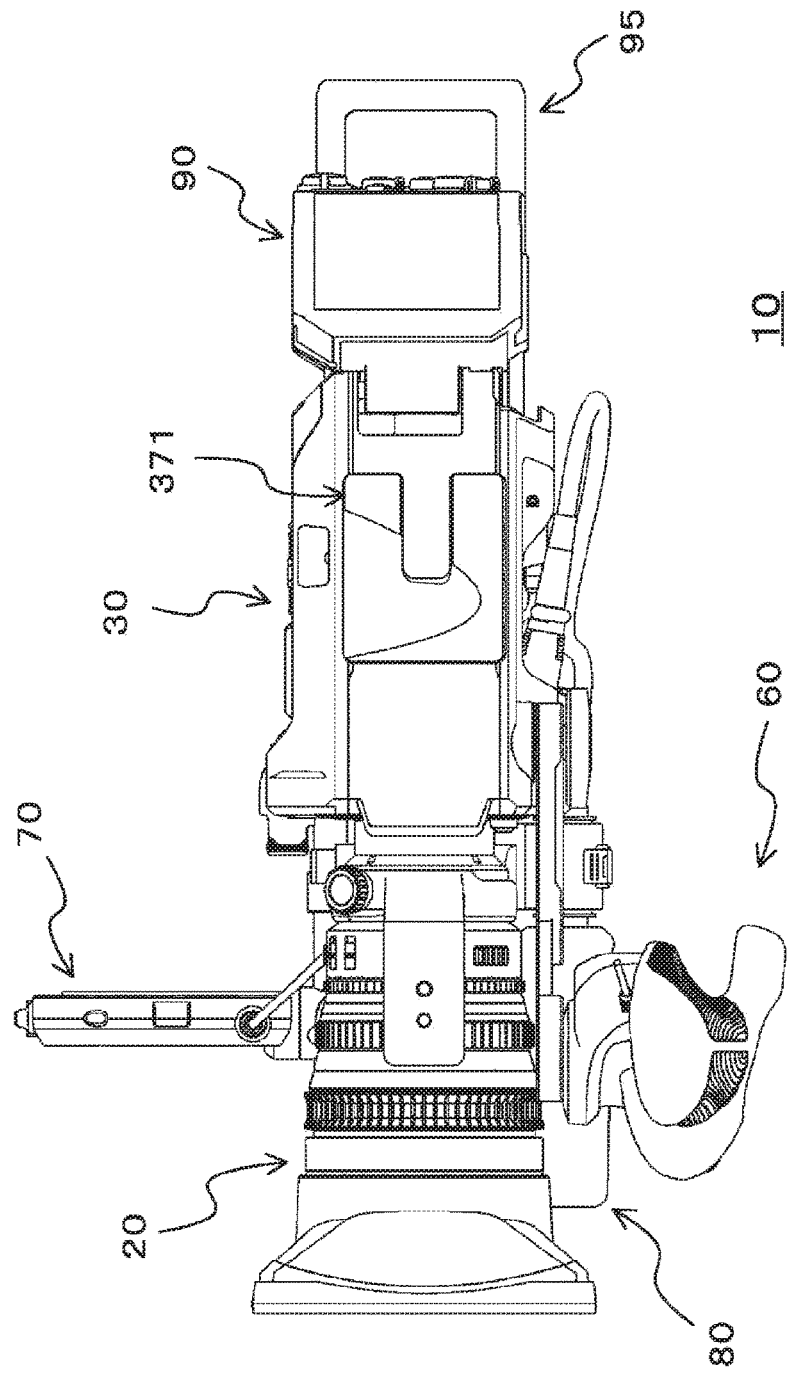
FIG. 10 is a bottom view of the imaging apparatus.

A description is provided hereinafter of an embodiment of the present technology. It is to be noted that the description is given in the following order.
1. Overall Configuration of Image Pickup Apparatus
1-1. External Configuration of Image Pickup Apparatus
1-2. Function Configuration of Image Pickup Apparatus
2. Configuration of Heat Dissipating Mechanism 1. Overall Configuration of Image Pickup Apparatus 1-1. External Configuration of Image Pickup Apparatus FIGS. 1 to 10 show an example of an exterior of an imaging apparatus according to the present technology. It is to be noted that FIG. 1 is a perspective view of the imaging apparatus viewed from a right front of the apparatus. FIG. 2 is a perspective view of the imaging apparatus viewed from a left front of the apparatus. FIG. 3 is a perspective view of the imaging apparatus viewed from a right rear of the apparatus. FIG. 4 is a perspective view of the imaging apparatus viewed from a left rear of the apparatus. FIG. 5 is a right side view of the imaging apparatus. FIG. 6 is a left side view of the imaging apparatus. FIG. 7 is a front view of the imaging apparatus. FIG. 8 is a rear view of the imaging apparatus. FIG. 9 is a plan view of the imaging apparatus. FIG. 10 is a bottom view of the imaging apparatus.

The imaging apparatus 10 shown in FIGS. 1 to 10 includes a lens unit 20, an apparatus body 30, a movable grip 60, a viewfinder 70, a microphone 80, and adapters 90, 95. It is to be noted that the lens unit 20, the movable grip 60, the viewfinder 70, the microphone 80, and the adapters 90, 95 may be provided separately from the apparatus body 30 by being formed to be detachable from the apparatus body 30.

The lens unit 20 is mounted to a front face of the apparatus body 30. This lens unit 20 includes an imaging lens for focusing light from a subject, a zoom mechanism for varying optical magnification of the imaging lens within a predetermined range, and others.

The apparatus body 30 has outwardly projecting sides and has the shape of a tube along an optical axis of the lens unit 20. For example, the apparatus body 30 has its sides projecting outward to form a tubular shape having a substantially octagonal section that is orthogonal to the optical axis. Moreover, the apparatus body 30 is formed with a chamfered inclination at a lower portion of its rear end when viewed from its side. The imaging apparatus 10 is formed with, for example, a chamfered inclination 321 having an arc-shaped curved edge as shown in FIGS. 5 and 6.

The apparatus body 30 is provided with, at its rear face, a battery mount, an adapter mount, and others that are not shown in the drawings. The battery mount is mounted with a battery that supplies power necessary for operation of the imaging apparatus 10. The adapter mount is mounted with the adapter 90.

The apparatus body 30 is formed with a handle 341 on its top face. The handle 341 is provided so that a user can grasp with a hand for holding the imaging apparatus 10 when carrying the imaging apparatus 10 or using the imaging apparatus 10 in a low position. The handle 341 is provided with a microphone mount 342 on one side (opposite to a user shooting in such a shoulder style that the imaging apparatus 10 is mounted on a shoulder) of its front end portion. The handle 341 is also provided with, on the other side of its front end portion (that is on the side of the user when the shoulder style is a usage pattern of the imaging apparatus 10), a support shaft 343 projecting from the side for holding the viewfinder 70. The microphone mount 342 is mounted with a microphone 80 at its front face.

As shown in FIGS. 4 and 6, the apparatus body 30 is provided with an operation unit 351, a recording medium mount 352, an inlet port 353, and others on its one side that is assumed to face a face of the user when the usage pattern of the imaging apparatus 10 is, for example, the shoulder style. The operation unit 351 is provided in a middle part of this side, the recording medium mount 352 is provided in a rear part of the side, and the inlet port 353 is provided in the middle part of the side on an upper portion side of the apparatus body 30.

The operation unit 351 is formed of operation switches or the likes for making various settings of the imaging apparatus 10. The recording medium mount 352 is used when a recording medium that records information signals including a video signal and an audio signal, such as a memory card that is formed by use of a semiconductor memory such as a flash memory, is mounted in the apparatus body 30. The inlet port 353 is a part of a heat dissipating mechanism of the apparatus body 30, and outside air is sucked in from this inlet port 353. The inlet port 353 is shaped, for example, to have a plurality of slit-shaped openings in its rectangular area.

As shown in FIGS. 3 and 5, the apparatus body 30 is provided with connection terminals 361, an exhaust port 363, and others on its other side. Its other side is also provided with a recess. For example, the other side is formed with, in its middle part, a recess that is substantially U-shaped in planar view. The connection terminals 361 are provided on a side of the recess in a position below the exhaust port 363. The exhaust port 363 is provided in a bottom face of the recess on the upper portion side of the apparatus body 30.

As shown in FIGS. 3 and 5, the apparatus body 30 is provided with connection terminals 361, an exhaust port 363, and others on its other side. Its other side is also provided with the recess in planar view. For example, the other side is formed with the recess that is substantially U-shaped in planar view. The connection terminals 361 are provided on the side of the recess in the position below the exhaust port 363. The exhaust port 363 is provided in the bottom face of the recess on the upper portion side of the apparatus body 30.

The connection terminals 361 each connect with a signal cable or the like that connects, for example, the viewfinder 70 or the microphone 80 to the apparatus body 30. These connection terminals 361 are provided in the position below the exhaust port 363, thereby preventing the signal cable or the like from blocking the exhaust port 363. The exhaust port 363 is a part of the heat dissipating mechanism of the apparatus body 30, and the outside air sucked in from the inlet port 353 is discharged from this exhaust port 363. The exhaust port 363 is shaped, for example, to have a plurality of slit-shaped openings in its rectangular area.

As shown in FIG. 5, the other side of the apparatus body 30 is also mounted with, for example, the movable grip 60 for giving support and others to the apparatus body 30 during shooting. The movable grip 60 is formed of a grip body 61 that is grasped by the user and an arm 62 that has one end provided with a first mount 62G to which the grip body 61 is mounted and the other end provided with a second mount 62B mounted to the apparatus body 30. The grip body 61 is mounted to be movable around the first mount 62G of the arm 62 with respect to the apparatus body 30. The arm 62 is mounted to the apparatus body 30 through use of a fixing lever 365 so that the grip body 61 is positionally movable around the second mount 62B with respect to the apparatus body 30. For example, the arm 62 is rotatable on the fixing lever 365 as indicated by arrow FC when the fixing lever 365 is loosened. Furthermore, when the fixing lever 365 is fastened, the arm 62 is positionally fixed relative to the apparatus body 30. The grip body 61 can thus have its position adjusted relative to the apparatus body 30 through operation of the fixing lever 365. Moreover, the grip body 61 of the movable grip 60 is provided with an unlock button (not shown in the drawings). Here, when the unlock button is operated to be in an unlock position, the grip body 61 becomes rotatable relative to the arm 62 in a direction indicated by arrow FA, shifting from its fixed state. When the unlock button is operated further to be in a lock position, the grip body 61 is fixed on the arm 62 in its present position. The grip body 61 can thus have its orientation adjusted relative to the apparatus body 30 through operation of the unlock button. Furthermore, the arm 62 is formed to be extensible as indicated by arrow FB, thus allowing adjustment of distance between the apparatus body 30 and the grip body 61.

The apparatus body 30 is provided with a shoulder pad 371, a tripod mount (not shown in the drawings) and others on its bottom face. The shoulder pad 371 is provided in a position to abut on the shoulder when the usage pattern of the imaging apparatus 10 is the shoulder style. In addition, the shoulder pad 371 is formed of soft material and has a curved shape for ease of mounting on the user's shoulder and cushioning. The tripod mount is provided with a screw hole for fixing the apparatus body 30 to a tripod or the like.

The viewfinder 70 is mounted to the support shaft 343 of the handle 341 via a viewfinder holder 75. This viewfinder 70 displays a camera-through image, an image recorded on the recording medium, a menu image, various pieces of information, and others. The microphone 80 collects external sounds and generates an audio signal. The adapters 90, 95 are intended for extending, for example, capabilities of the imaging apparatus 10. For example, the adapter 95 is an additional battery, and the adapter 90 connects this additional battery to the apparatus body 30. It is to be noted that since the adapters 90, 95 are used for extending, for example, the capabilities of the imaging apparatus 10, the shooting can be carried out even without the adapters 90, 95.

1-2. Function Configuration of Image Pickup Apparatus

Figure 11:
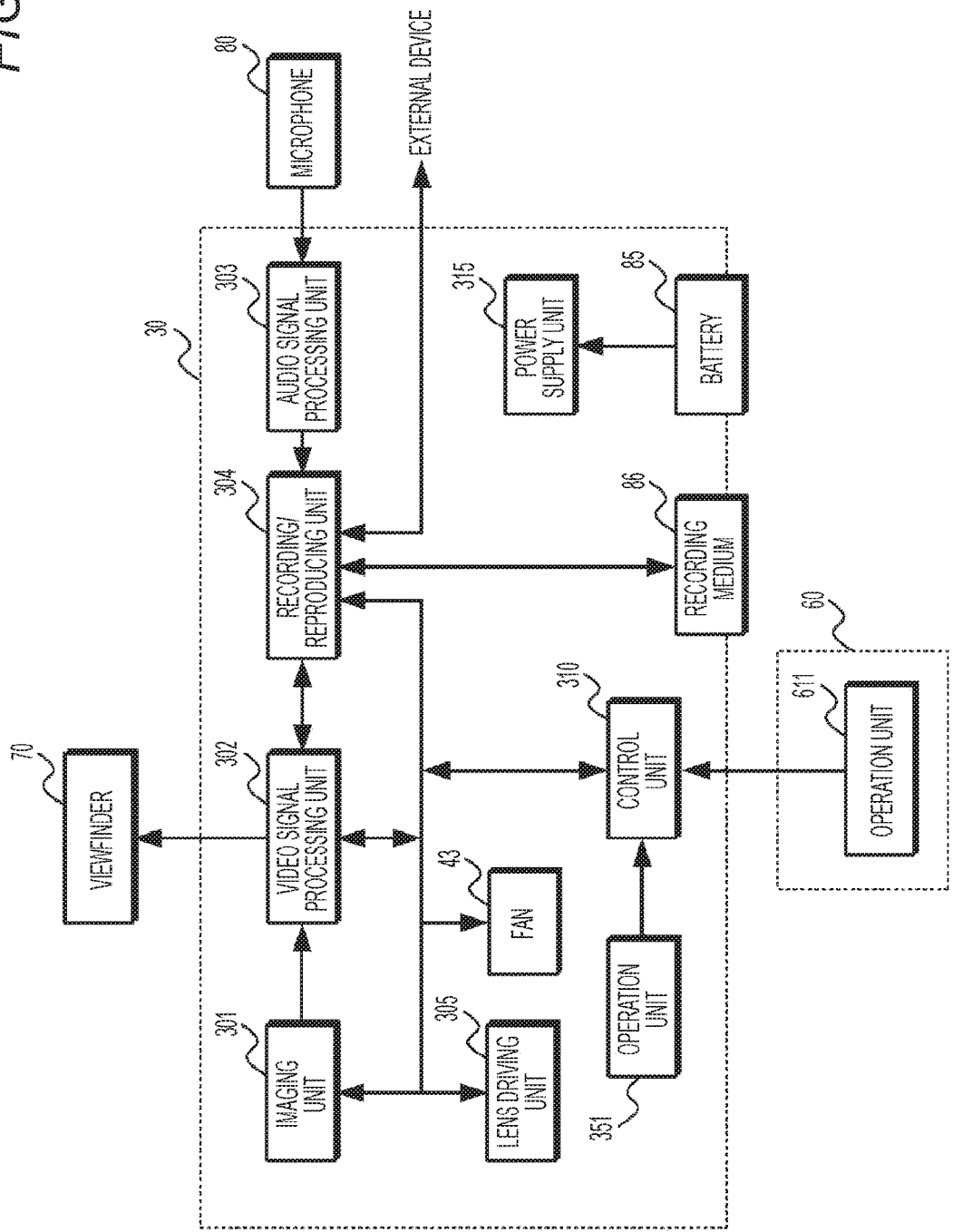
FIG. 11 is a functional block diagram of the imaging apparatus.

FIG. 11 is a functional block diagram of the imaging apparatus. The apparatus body 30 includes an imaging unit 301, a video signal processing unit 302, an audio signal processing unit 303, a recording/reproducing unit 304, a lens driving unit 305, the operation unit 351, a control unit 310, a power supply unit 315, a fan 43 and others.

The imaging unit 301 is formed by use of an image sensor such as a complementary metal-oxide semiconductor device (CMOS device), a Charge-Coupled Device (CCD) or the like. The imaging unit 301 performs photoelectric conversion on an optical image that is formed on an imaging surface by the lens unit 20 and generates an imaging signal for output to the video signal processing unit 302. In addition, the imaging unit 301 is provided with a drive circuit for driving the image sensor. It is to be noted that this drive circuit may be provided separately from the imaging unit 301.

The video signal processing unit 302 performs noise reduction, gain control, and brightness and color control on the imaging signal. Moreover, the video signal processing unit 302 converts a video signal such as has undergone the controls or is read out by the recording/reproducing unit 304 into a video signal corresponding to the number of pixels of the viewfinder 70 and superimposes a display signal of a menu display or the like on the video signal. In addition, the video signal processing unit 302 may perform on a viewfinder image video processing such as for an enlarged display of a central portion so that a desired captured image can be obtained with ease. The video signal processing unit 302 outputs the video signal thus processed to the viewfinder 70.

The audio signal processing unit 303 performs processing such as amplifying the audio signal generated by the microphone 80 and provides an output to the recording/reproducing unit 304.

The recording/reproducing unit 304 records the information signal such as the video signal or the audio signal on the recording medium 86 on the basis of a command from the control unit 310 and reads out and reproduces the information signal recorded on the recording medium 86. Moreover, the recording/reproducing unit 304 performs processing such as supplying the video signal read out from the recording medium 86 to the viewfinder 70 via the video signal processing unit 302. Furthermore, the recording/reproducing unit 304 performs processing such as outputting the information signal in a predetermined format to an external device. It is to be noted that the recording medium 86 may be either a detachable recording medium such as to be inserted from the recording medium mount 352 shown in FIGS. 4 and 6 or a recording medium fixedly provided inside the apparatus body 30.

The lens driving unit 305 drives the lens unit 20 for setting of a desired zoom magnification on the basis of a command from the control unit 310. In addition, the lens driving unit 305 may perform focus adjustment so that the optical image formed on the imaging surface of the solid-state image sensor of the imaging unit 301 becomes a clear image.

The operation unit 351 is provided on the one side of the apparatus body 30 as shown in FIGS. 4 and 6 and is formed of the operation switches. This operation unit 351 generates and outputs to the control unit 310 an operation signal corresponding to a switch operation by the user.

An operation unit 611 is formed of operation switches provided on the grip body of the movable grip 60. The operation unit 611 generates and outputs to the control unit 310 an operation signal corresponding to a switch operation by the user. It is to be noted that at least one of the switch having a fixed function and the switch capable of function changes is included in the operation unit 611. For example, the operation unit 611 is provided with as the switch having the fixed function, at least one of a zoom switch that adjusts focal distance of the lens unit and a REC switch that gives an instruction to start or end recording. The operation unit 611 is also provided with, for example, an assignable button that is a switch capable of the function changes and a setting button for assigning a function to the assignable button and changing the assigned function. It is to be noted that the operation unit 611 may also be provided with a power switch and others.

The control unit 310 is formed of, for example, a Central Processing Unit (CPU), an Electrically Erasable Programmable ROM (EEPROM), a Read Only Memory (ROM), a Random Access Memory (RAM), and others that are not shown in the drawing. The ROM of the control unit 310 is stored with programs for various controls that are executed by the control unit 310. The CPU operates on the basis of an applicable program and executes arithmetic/control processing necessary for each of the controls through use of the RAM. Previous storage of the programs is not limited to the ROM built into the apparatus body 30. The programs may be stored in a removal recording medium and provided to the apparatus body 30 or may be downloaded into the apparatus body 30 via a LAN, the internet or the like.

On the basis of the user operation of the operation unit 351, 611, the control unit 310 controls each of the units so that the imaging apparatus 10 operates according to the user operation. The control unit 310 powers on or off the imaging apparatus 10 on the basis of, for example, the user operation of the power switch. The control unit 310 also controls the lens driving unit 305 on the basis of the user operation of the zoom switch, thus changing the focal distance of the lens unit 20 according to the user operation. The control unit 310 also causes recording of the information signals to start or stop on the basis of the user operation of a REC button.

The control unit 310 also performs such control as to execute the function assigned to the operated assignable button on the basis of the user operation of the assignable button. Furthermore, the control unit 310 assigns the function to the assignable button on the basis of the user operation of the setting button. It is to be noted that the assignable button can be assigned with, for example, a display function for various markers, a recording review function, a viewfinder mode switching function, a viewfinder image switching function for facilitated focus adjustment or a display function for brightness information.

Still furthermore, the control unit 310 controls the fan 43 for discharging heat caused inside the apparatus body 30 out of the apparatus body 30. For example, the control unit 310 causes discharge of heat generated by the video signal processing unit 302, the recording/reproducing unit 304, and others out of the apparatus body 30, thereby preventing the components used inside the apparatus body 30 from being increased in temperature.

The power supply unit 315 supplies the power to each of the units of the imaging apparatus 10 from the battery 85 mounted to the apparatus body 30. In cases where, for example, the additional battery is mounted to the apparatus body 30, the power supply unit 315 also supplies power from this additional battery.

For the purpose of releasing the heat caused inside the apparatus body 30 outside the apparatus body 30, the fan 43 takes in the outside air from the inlet port provided in the one side of the apparatus body 30 and discharges heated air from the exhaust port provided in the other side of the apparatus body 30.

2. Configuration of Heat Dissipating Mechanism

Figure 12:
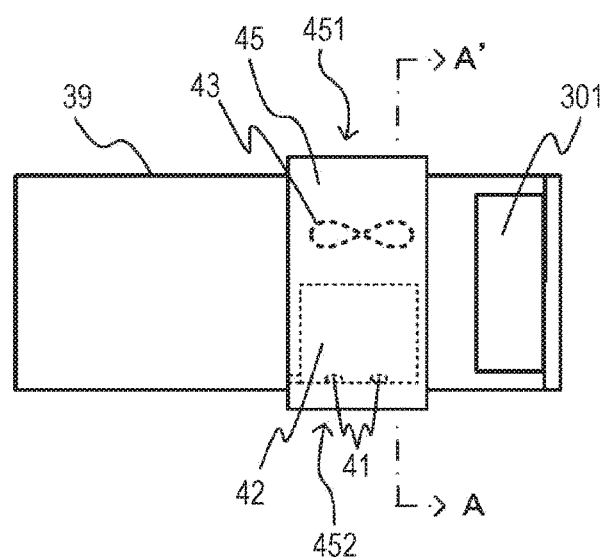
FIGS. 12(A) and 12(B) are schematic views of a heat dissipating mechanism.
Figure 12:
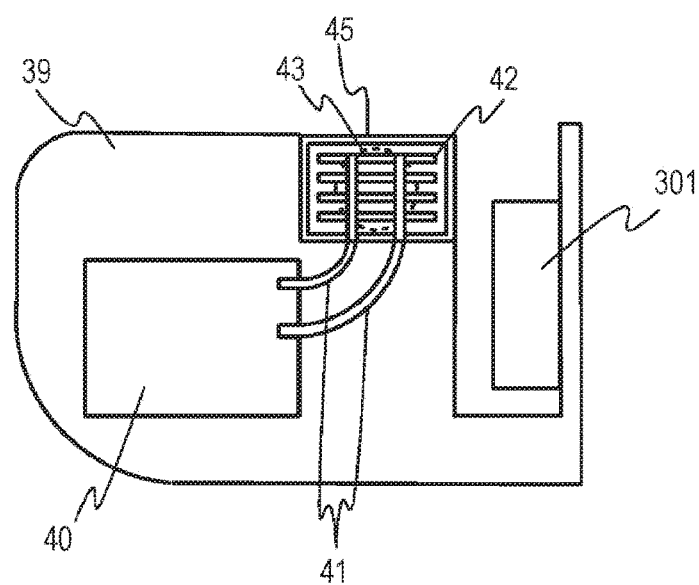
Figure 13:
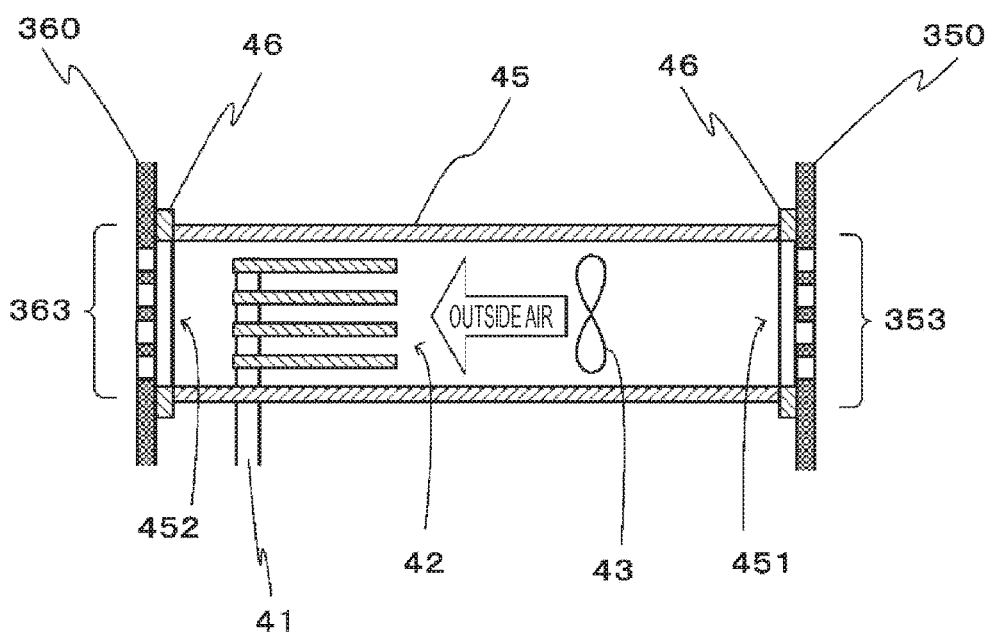
FIG. 13 shows relationships between the heat dissipating mechanism and respective side plates of an apparatus body.

FIGS. 12(A) and 12(B) are schematic views of the heat dissipating mechanism. It is to be noted that FIGS. 12(A) and 12(B) are a right side view and a plan view, respectively, each showing in schematic form the heat dissipating mechanism provided inside the apparatus body. Moreover, FIG. 13 is a sectional view taken along position A-A' in FIG. 12(B), schematically illustrating relationships between the heat dissipating mechanism and respective side plates of the apparatus body.

A housing 39 of the apparatus body is mounted with a heat sink 40 of a heat transfer unit. The heat transfer unit is formed of, for example, the heat sink 40 and heat pipes 41. The heat sink 40 is fitted with, for example, the components that generate the heat, so that the heat generated by those components inside the apparatus body is transmitted to the heat sink 40. Each of the heat pipes 41 has one end connected to the heat sink 40 and the other end mounted to a radiating fin 42. The heat pipes 41 transmit to the radiating fin 42 the heat that is transmitted from the components to the heat sink 40.

The radiating fin 42 is formed of, for example, a plurality of fins facing one another across a predetermined interval. This radiating fin 42 is provided inside a duct 45 and discharges the heat transmitted by the heat transfer unit out of the imaging apparatus by using the outside air passing through the duct 45.

The duct 45 has a tubular shape and is provided in an upper portion of the apparatus body. Moreover, the duct 45 has one opening 451 that is in a position to face the inlet port 353 provided in a side plate 350 forming the one side of the apparatus body. Furthermore, the duct 45 has the other opening 452 that is in a position to face the exhaust port 363 provided in a side plate 360 forming the other side of the apparatus body. The side plate 350 and the side plate 360 are each coupled to the duct 45 via a seal member, thereby having watertightness at their parts connecting with the duct 45 when mounted to the housing 39. Thus, water drops, dust, and others that enter from the inlet port 353 (or the exhaust port 363) are discharged from the exhaust port 363 (or the inlet port 353) without entering the apparatus body from the parts of connection between the duct 45 and the respective side plates 350, 360.

Inside the duct 45, the fan 43 is fixedly provided to suck in the outside air from the inlet port 353 for discharge from the exhaust port 363. Moreover, the radiating fin 42 is fixed between the fan 43 and the exhaust port 363 inside the duct 45. The radiating fin 42 is provided so that a laminated direction of its fins is orthogonal to a direction in which the outside air flows, thereby facilitating flow of the outside air, which is sucked from the inlet port 353, between the fins. Parts of the duct 45 where the heat pipes 41 are mounted, a feed part for the fan 43 in the duct 45 (that is, for example, a part of the duct 45 where a cable is mounted for supplying a drive signal or the like), and others are formed to have watertightness. For example, the heat pipes 41 and the feed part for the fan 43 are fixed to the duct 45 through use of, for example, a seal member 46. Thus, water drops, dust and others that enter from the inlet port 353 and the exhaust port 363 are prevented from entering the apparatus body from, for example, the parts of connection between the duct 45 and the respective heat pipes 41 and the part of connection between the duct 45 and the feed part for the fan 43.

The housing 39 of the apparatus body is also fittingly mounted with the imaging unit 301 at its front. Accordingly, heat generated by the solid-state image sensor or heat generated by the solid-state image sensor and the drive circuit for the solid-state image sensor is transmitted to the housing 39. For this reason, the heat generated by the imaging unit 301 is dissipated outward through the housing 39.

In this technology, the heat caused inside the apparatus body is thus transmitted through the heat sink 40 and the heat pipes 41 of the heat transfer unit to the radiating fin 42 provided inside the duct 45, and the fan 43 provided inside the duct 45 sucks in the outside air from the inlet port 353 for discharge from the exhaust port 363. Consequently, the heat caused inside the apparatus body and transmitted to the radiating fin 42 is discharged out of the imaging apparatus by the outside air passing through the duct 45. In this way, the heat discharged inside the apparatus body is reduced, so that an interior of the apparatus body and the components used inside the apparatus body can be prevented with ease from being increased in temperature.

Moreover, the heat generated by the imaging unit 301 is dissipated outward through the housing 39, so that the imaging unit 301 can have its temperature prevented from exceeding a predetermined temperature. The outward dissipation of the heat generated by the imaging unit 301 through the housing 39 also enables, for example, size reduction of the radiating fin 42 and the duct 45 as compared with cases where the heat generated by the imaging unit 301 is also transmitted to the radiating fin 42 for discharge out of the imaging apparatus. In other words, an area occupied by the heat dissipating mechanism can be made smaller in the apparatus body.

Furthermore, providing the duct 45 in the upper portion of the apparatus body can reduce influence of the discharged outside air heated by the radiating fin 42 as compared with cases where the duct 45 is provided in a central portion or in a lower portion of the apparatus body. Still furthermore, when the usage pattern is the shoulder style, the inlet port 353 is provided in the side of the apparatus body that is on the side of the user, while the exhaust port 363 is provided in the side of the apparatus body that is opposite to the user. Thus, the heated outside air is not discharged toward the user.

Still furthermore, the exhaust port 363 is provided in the bottom face of the recess, which is substantially U-shaped in planar view, in the other side of the apparatus body 30 as shown in FIGS. 3 and 5, so that the exhaust port 363 can be hard to block. In addition, in cases where the other side of the apparatus body 30 is provided with the connection terminals 361 each for connection with the signal cable or the like, the connection terminals 361 are provided on the side of the recess, which is provided with the exhaust port 363, in the position below the exhaust port 363. With the signal cable or the like being connected to the connection terminal 361, a space is thus secured by the connected signal cable or the like even when another object come close to the exhaust port 363, so that the exhaust port 363 can be harder to block. It is to be noted that the recess provided with the exhaust port 363 is not limited to be substantially U-shaped in planar view and may have another shape on condition that the exhaust port 363 is hard to block.

Still furthermore, the side plates 350, 360, the heat pipes 41, the feed part for the fan 43 and the others are mounted to the duct 45 so as to have watertightness. Accordingly, water drops, dust and others entering from the inlet port 353 or the exhaust port 363 can be prevented from adversely affecting operation of a drive mechanism, an electric circuit and others inside the apparatus body. This means that a usage environment of the imaging apparatus is less limited, so that the imaging apparatus of the present technology can be used for shooting in diverse environments. Still furthermore, the inlet port 353 and the exhaust port 363 are provided in the sides of the apparatus body 30, thereby rendering the entry of water drops, dust and others difficult as compared with cases where the exhaust port and the like are provided, for example, in the top of the apparatus body.

It is to be noted that the effects described in the present specification are shown simply as examples and are not limiting, and there may be added effects that are not described. Moreover, the present technology is not to be construed as being limited to the above-described embodiment of the technology. The embodiment of this technology discloses the present technology in the form of the example, and it is obvious that those skilled in the art can make modifications and replacements in the embodiment without departing from the gist of the present technology. This means that the claims should be taken into consideration in determining the gist of the present technology.

Moreover, the imaging apparatus of the present technique can instead be constructed as follows.

(1) An imaging apparatus including:
a tubular duct having one opening mounted in a position to face an inlet port provided in one side of an apparatus body, and another opening mounted in a position to face an exhaust port provided in another side of the apparatus body;
a fan provided in a tubular interior of the duct for causing outside air to flow in from the inlet port for discharge from the exhaust port;
a radiating fin provided in the tubular interior of the duct; and
a heat transfer unit for transmitting heat caused inside the apparatus body to the radiating fin.

(2) The imaging apparatus described in (1), wherein a recess is provided in the side of the apparatus body, and the recess is provided with, in a bottom face of the recess, the exhaust port or both the exhaust port and the inlet port.

(3) The imaging apparatus described in (2), wherein the apparatus body is provided with the recess in the side of the apparatus body in planar view.

(4) The imaging apparatus described in (3), further including, a connection terminal provided at a side of the recess provided with the exhaust port and provided in a position below the exhaust port.

(5) The imaging apparatus described in any one of (1) to (4), wherein parts of connection between the duct and the side of the apparatus body have watertightness.

(6) The imaging apparatus described in (5), wherein a feed part for the fan in the duct and a part of the duct where the heat transfer unit is mounted have watertightness or both the watertightness and tightness.

(7) The imaging apparatus described in any one of (1) to (6), wherein the duct is provided in an upper portion of the apparatus body.

(8) The imaging apparatus described in any one of (1) to (7), wherein the heat transfer unit transmits to the radiating fin the heat generated by units other than an imaging unit that is formed of an image sensor or formed of the image sensor and a drive circuit for driving the image sensor.

(9) The imaging apparatus described in (8), wherein the heat generated by the imaging unit is dissipated through a housing of the apparatus body.

INDUSTRIAL APPLICABILITY

An imaging apparatus of this technology is provided with: a tubular duct having one opening mounted in a position to face an inlet port provided in one side of an apparatus body and another opening mounted in a position to face an exhaust port provided in another side of the apparatus body; a fan provided in a tubular interior of the duct for causing outside air to flow in from the inlet port for discharge from the exhaust port; a radiating fin provided in the tubular interior of the duct; and a heat transfer unit for transmitting heat caused inside the apparatus body to the radiating fin. Accordingly, the heat caused inside the apparatus can be discharged efficiently out of the apparatus. This imaging apparatus is suitable, for example, as a commercial video camera that generates a large quantity of heat inside itself.

REFERENCE SIGNS LIST

10 Imaging apparatus
20 Lens unit
30 Apparatus body
39 Housing
40 Heat sink
41 Heat pipe
42 Radiating fin
43 Fan
45 Duct
46 Seal member
60 Movable grip
70 Viewfinder
80 Microphone
301 Imaging unit
302 Video signal processing unit
303 Audio signal processing unit
304 Recording/reproducing unit
310 Control unit
350, 360 Side plate
353 Inlet port
361 Connection terminal
363 Exhaust port
451, 452 Opening

The invention claimed is:

1. An imaging apparatus, comprising:
   a tubular duct comprising one opening mounted in a position to face an inlet port provided in one side of an apparatus body, and another opening mounted in a position to face an exhaust port provided in another side of the apparatus body;
   a fan provided in a tubular interior of the tubular duct for causing outside air to flow in from the inlet port for discharge from the exhaust port;
   a radiating fin provided in the tubular interior of the tubular duct; and
   a heat transfer unit for transmitting heat caused inside the apparatus body to the radiating fin.

2. The imaging apparatus according to claim 1, wherein a recess is provided in the side of the apparatus body and is provided with, in a bottom face of the recess, the exhaust port or both the exhaust port and the inlet port.

3. The imaging apparatus according to claim 2, wherein the apparatus body is provided with the recess in the side of the apparatus body in planar view.

4. The imaging apparatus according to claim 3, further comprising, a connection terminal provided at a side of the recess provided with the exhaust port and provided in a position below the exhaust port.

5. The imaging apparatus according to claim 1, wherein parts of connection between the tubular duct and the side of the apparatus body have watertightness.

6. The imaging apparatus according to claim 5, wherein a feed part for the fan in the tubular duct and a part of the tubular duct where the heat transfer unit is mounted have watertightness or both the watertightness and tightness.

7. The imaging apparatus according to claim 1, wherein the tubular duct is provided in an upper portion of the apparatus body.

8. The imaging apparatus according to claim 1, wherein the heat transfer unit transmits to the radiating fin the heat generated by units other than an imaging unit that is formed of an image sensor or formed of the image sensor and a drive circuit for driving the image sensor.

9. The imaging apparatus according to claim 8, wherein the heat generated by the imaging unit is dissipated through a housing of the apparatus body.

* * * * *